United States Patent [19]

Misaka et al.

[11] Patent Number: 5,421,934
[45] Date of Patent: Jun. 6, 1995

[54] DRY-ETCHING PROCESS SIMULATOR

[75] Inventors: Akio Misaka, Moriguchi; Kenji Harafugi, Hirakata; Masafumi Kubbota, Osaka; Noboru Nomura, Kyoto, all of Japan

[73] Assignee: Matsushita Electric Industrial Co., Ltd., Osaka, Japan

[21] Appl. No.: 37,298

[22] Filed: Mar. 26, 1993

[51] Int. Cl.⁶ .............................................. H01L 21/00
[52] U.S. Cl. ........................................ 216/59; 216/67
[58] Field of Search ................ 156/626, 627, 643, 646; 204/192.33

[56] References Cited

U.S. PATENT DOCUMENTS 4,493,745  1/1985  Chen et al. ........................... 156/626
5,070,469  12/1991  Kunikiyo et al. .................... 364/578
5,282,140  1/1994  Tazawa et al. ....................... 364/468

Primary Examiner—Thi Dang
Attorney, Agent, or Firm—Rogers & Wells

[57] ABSTRACT

A new surface reaction model has been presented to simulate topological evolutions by taking into account the existence of absorbed radicals on the substrate surface. The model treats the etching rate as a function of the coverage ratio by absorbed radicals on the surface. Based on the model, a two-dimensional topography simulator has been provided. The simulator is applied to silicon-dioxide trench teachings made by hydrofluorcarbon gases. The topography simulator is used in a dry-etching process for realizing sub-half micron patternings.

6 Claims, 8 Drawing Sheets

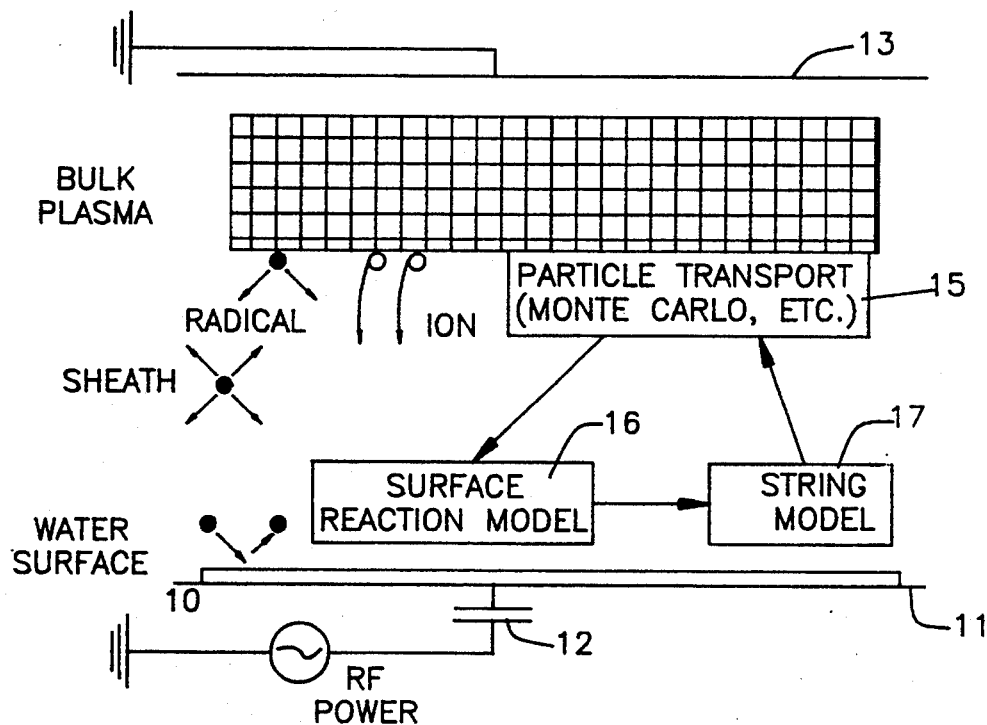
FIG. 1
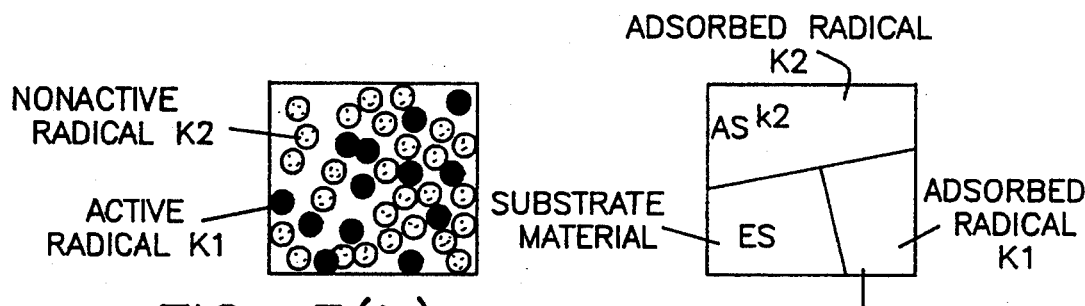
FIG. 3(b)
FIG. 3(c)
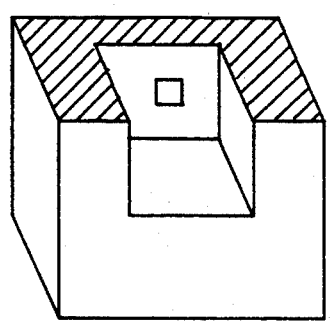
FIG. 3(a)

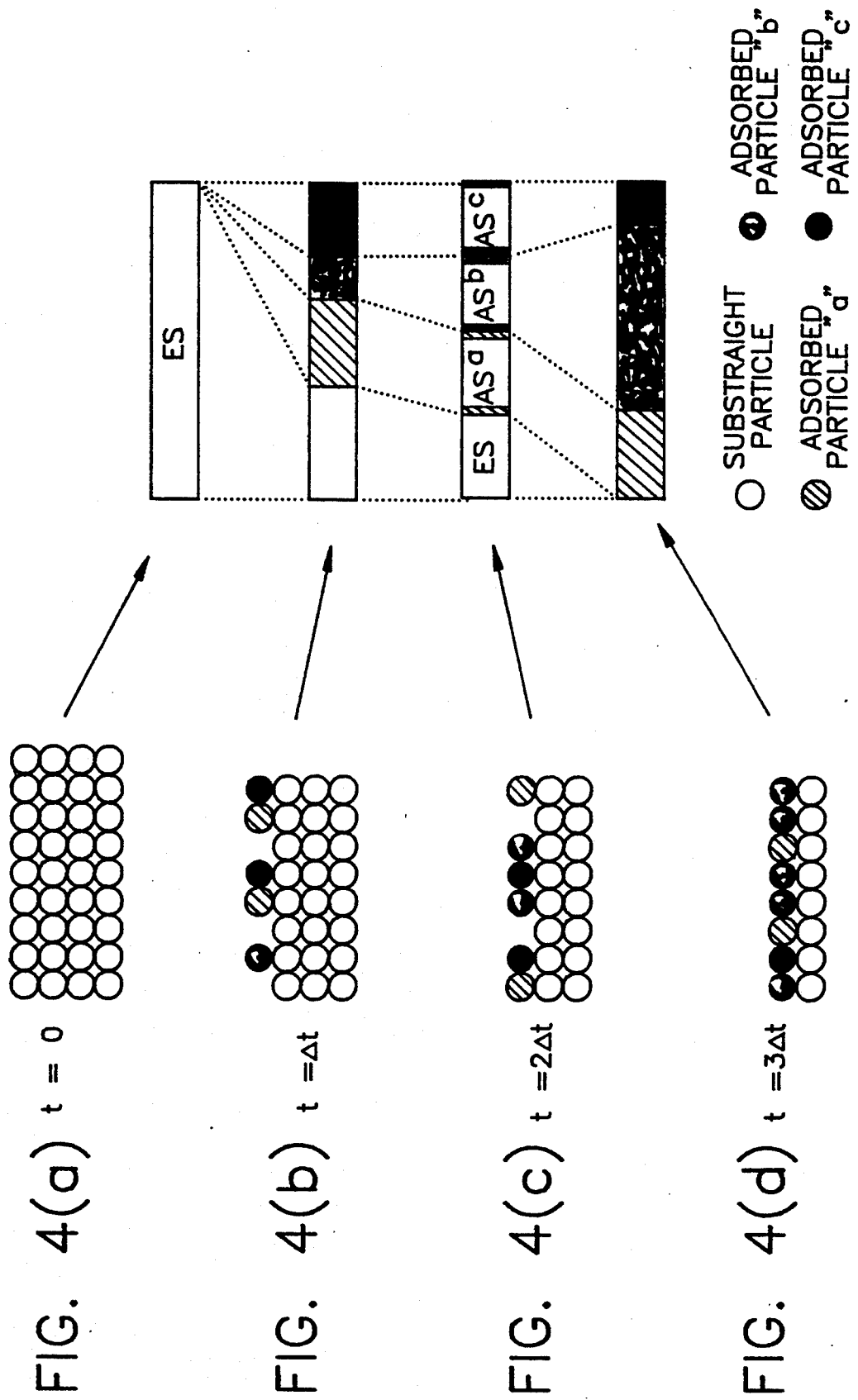

DRY-ETCHING PROCESS SIMULATOR

BACKGROUND OF THE INVENTION

1. Field of the Invention

This invention relates to a dry-etching microfabrication processes and more particularly to a topography simulator for the dry-etching microfabrication processes for determining the optimum conditions of dry-etching on a substrate

2. Description of the Prior Art

The state-of-art semiconductor technology as seen in fabrication of dynamic random access memories (DRAMs) has been advanced to further enhancement of high density and microfabrication technology. The sizes of transistor gates, wirings and capacitor forming elements and so forth are on the half micron range. To realize such sub-micron patternings, dry etching is carried out on underlying materials to be worked by utilizing ions and radicals (active neutrals in excited state) produced in a discharge plasma area, while a resist patterned according to design data is used as mask.

FIG. 1 shows a typical parallel plate dry etcher of the reactive ion etching type (RIE) and related module configurations of a simulational system. A wafer spacemen 10 is placed on a cathode electrode 11 supplied with RF power via a coupling condenser 12. Ions are accelerated substantially in a vertical direction and induced onto the spacemen 10, while traveling through a bulk plasma region and a sheath region formed over a cathode electrode 13. Radicals, on the other hand, are transported to the wafer surface in isotropic kinetic direction.

FIG. 2 shows four kinds of surface reactions which determine etching profiles. A reaction scheme of deposition is also shown in FIG. 2 where a compound layer is deposited on the substrate when non-reactive radicals are coming. The first surface reaction is a thermally induced chemical reaction as seen in FIG. 2(a). Active radicals are adsorbed on the substrate surface, and then these radicals react with substrate material by the thermal energy of the substrate to produce reaction products having a high vapor pressure. The reaction products are desorpted so that the substrate is etched isotopically. The second and third are ion sputtering. There are two types of ion sputterings. One is physical sputtering as seen in FIG. 2(b), which is induced by an energetic ion. Atoms of the substrate material obtain kinetic energy by momentum transfer due to collision-cascade mechanism and then are sputtered. As a result, the materials present on the substrate are etched away in the incident direction of the ions. The other is chemical sputtering as seen in FIG. 2(c). Incoming ions of active species induce a chemical reaction with the substrate material. Like the physical sputtering, this reaction etches the substrate material in the incident direction of the ions.

The fourth reaction as shown in FIG. 2(d) is ion-assisted etching. This is a reaction between adsorbed active radicals and substrate material enhanced by a simultaneous ion bombardment. The ion-assisted etching proceeds as follows.

Assume that absorbed layer of active neutrals has been formed on the substrate. Kinetic energy of the incoming ions activates a plurality of the absorbed particles near the impingement of the ions and promotes remarkably chemical reaction between the activated active absorbed radicals and the materials on the substrate. The reaction products are thus desorpted.

Should ions of the same kinetic energy and same mass be impinged, an etching rate obtained when the surface material is exposed to both active radicals and energetic ions simultaneously, is about ten times higher than that of physical sputtering. The ion-assisted etching plays the most important and dominating role among the etching reactions taking ion impingement into account. Similarly, this reaction etches away the materials on the substrate substantially in the incident direction of the ions.

To form minute patternings through etching, there are two criteria to meet, i.e., topography control and selectivity. The first requirement of topography control is anisotropy of etching by which patterns are formed in strict compliance with the sizes of masks and topographic profiles are realized in a vertical or, if desired, tapered orientation. The second requirement of selectivity is that there be enough allowance of etching between the etching rate of mask material and underlying materials and the etching rate of the material to be etched.

As theoretical analysis means for solving the above discussed problems, several topography simulators have been reported. With the development of such topography simulators, various types of reaction processes have been incorporated to simulate fundamental facts of experiments. However, the conventional simulators were designed to give the etching rate and deposition rate defining topographic deformation, as a function of the fluxes of incoming ions and radicals at respective points of the substrate surface, merely through the semi-experimental techniques. In other words, the surface conditions such as the presence of absorbed particles on the substrate were not taken into consideration.

For the conventional simulator, it was, therefore, difficult to evaluate difference between transport rate limited and reaction rate limited in the thermally induced chemical reaction by the active radicals, the ion-assisted etching reaction or the side-wall protection phenomena by competitive process between etching and deposition and so forth. In other words, the conventional simulators were not successful tools which provide satisfactory solution to the above problems in the state-of-art dry-etching processes requiring sub-micron patternings.

Returning to FIG. 1, the simulator consists of three modules. The first module 15 is a particle transport model which calculates the fluxes of radicals and ions arriving at the substrate surface. Ions are accelerated by the electrical field in the sheath region. An angular distribution of ion flux arriving at the substrate surface is approximated by Gaussian distribution. The standard deviation of Gaussian distribution is obtained by the Monte-Carlo technique. Indirect radical flux by re-emission process is included by taking into account the substrate surface profile. The second module 16 is a surface reaction model which calculates etching and/or deposition rates on the substrate surface. This part is the main subject of the present invention. The third module 17 is a string model which expresses the time evolutions of the surface profile.

SUMMARY OF THE INVENTION

Accordingly, it is an object of the present invention to provide a dry-etching process simulator including a surface reaction model which meets the above discussed requirement of topography control.

It is another object of the present invention to provide a two-dimensional topography simulator for dry-etching microfabrication processes which provides accurate simulation of etching processes of silicon oxide layers.

To achieve the above object, there is provided a dry-etching process, one of LSI fablication processes, wherein minute patterns formed in the previous lithography process are used as mask and an operation unit in a topography simulator evaluates etching and deposition rates for determining the optimum etching conditions in forming on a substrate patterns of the same sizes as that of the mask.

According to the teachings of the present invention, the amount of reaction between absorbed materials and a substrate is taken into consideration for etching rate evaluation to make rate calculation more accurate when etching profiles are simulated during the dry-etching processes. To this end, the rate evaluation process in the dry-etching processes comprises the step of evaluating the coverage ratio by absorbed materials on individual small areas of the substrate surface, and the step of evaluating etching and deposition rates on the individual small areas of the substrate surface by taking into account the amount of reaction between the absorbed materials and the substrate as derived from the coverage ratio by the absorbed materials. The second step is followed by topography deformation step which is responsive to the etching and deposition rates so evaluated. The dry-etching process is then returned to the first step.

This etching and deposition rate evaluation process is incorporated into the operation unit in the topography simulator in the dry-etching processes, thus achieving efficiently optimization of etching conditions for minute patternings.

In one aspect of the present invention, the coverage ratio by the absorbed materials on each point of the substrate surface is evaluated by the density of the respective radicals and ions in an active gas plasma and the reaction rate of the respective radicals and ions.

In another aspect of the present invention, the evaluation of the coverage ratio by the absorbed materials on individual small areas of the substrate involves evaluation of the amount of absorption of the respective absorbed materials per unit time, evaluation of the amount of desorption of the respective absorbed materials per unit time and evaluation of such a ratio of the absorbed materials as to equal the amount of absorption and the amount of desorption per unit time.

In evaluating the etching and deposition rates, the situation where the area is entirely covered with the absorbed materials is considered as deposition and the situation where the area is only partially covered with the absorbed materials is considered as etching.

In still another aspect of the present invention, the etching and deposition rate evaluation involves the step of determining a reaction rate by combinations of the absorbed materials and the substrate in proportion to the coverage ratios by the respective absorbed materials, the step of determining a reaction rate by combinations of the radicals and ion arriving at the substrate surface and the substrate in proportion to the extent to which the area is not covered with the absorbed materials and to the fluxes of the individual incoming particles, the step of determining a reaction rate by combinations of the absorbed materials, the substrate and the individual incoming radicals and ions in proportion to the coverage ratios of the individual absorbed materials and the fluxes of the individual incoming particles, and the step of combining these reaction rates for evaluating the etching and deposition rates.

Other and further objects, features and advantages of the present invention will be more fully apparent from the following description taken in connection with the accompanying drawings.

BRIEF DESCRIPTION OF THE DRAWINGS

FIG. 1 is a schematic diagram of a typical parallel-plate dry etcher and related module configuration of a topography simulator according to the present invention;

FIGS. 3($a$), 3($b$) and 3($c$) illustrate the concept of "small reaction surface (SRS)" wherein FIG. 3($a$) is a cross sectional view of a contact hole on the substrate, FIG. 3($b$) is a plan view of a small area representing a point on the side wall of the contact hole and FIG. 3($c$) shows three kinds of absorbed particles on the area;

FIGS. 4($a$) to 4($d$) are schematic diagrams for the time evolution of surface conditions as a function of an artificial time $t$;

DETAILED DESCRIPTION OF THE PREFERRED EMBODIMENTS

Figures 2A, 2B, 2C, 2D, 2E:
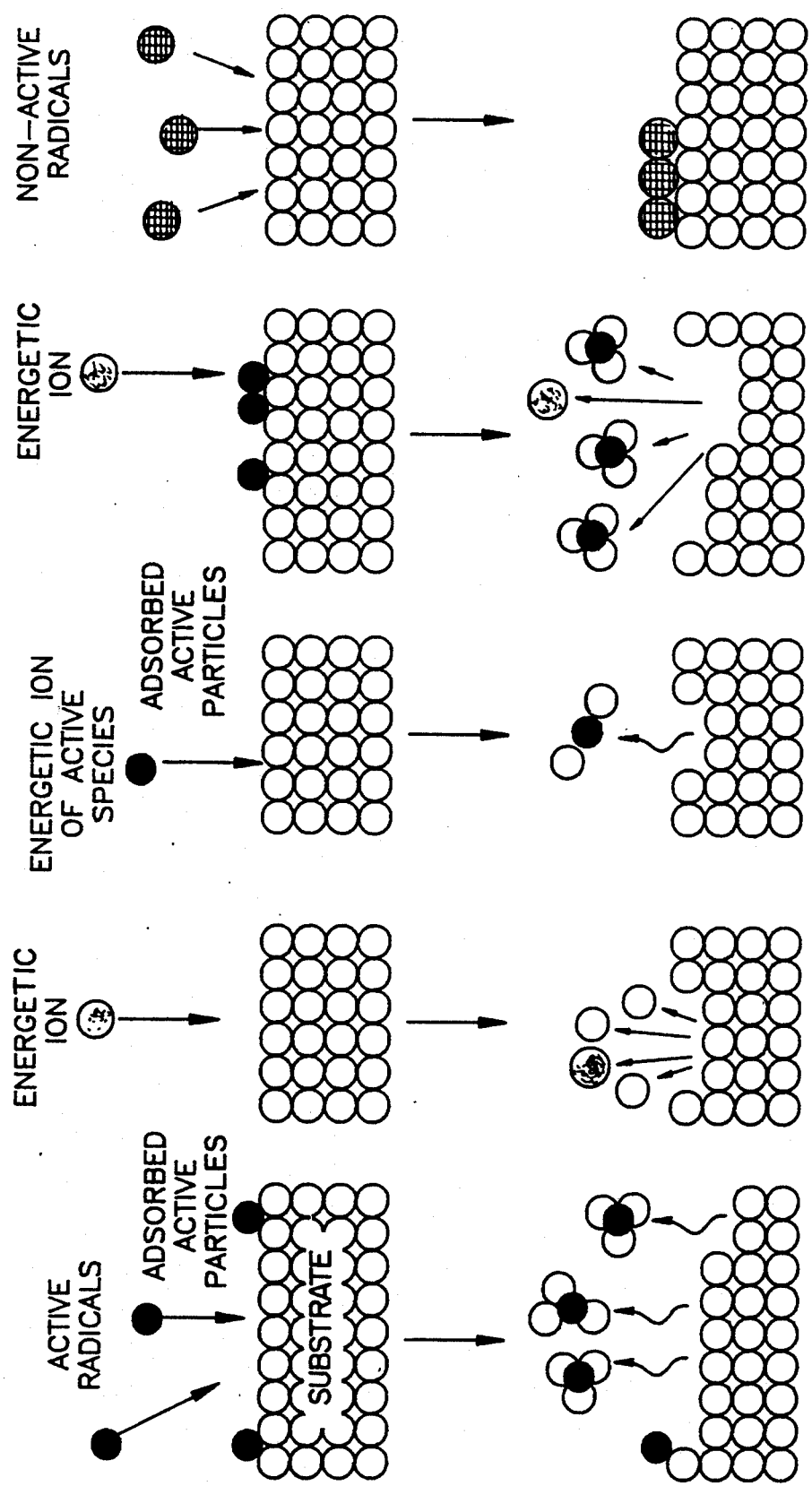
FIG. 2 shows five kinds of basic surface reaction models.

Generally, surface reactions on the substrate pass through the processes of absorption of incoming particles, mixing, reactions and desorption. Under the etching environment where both active and non-active neutrals and ions are transported to the substrate surface simultaneously, however, the combined processes of both of the neutrals and ions should be considered. For example, some cases are seen where the incoming ions activate the absorbed particle layer on the substrate to promote chemical reactions between the absorbed particles and the substrate. Other cases are also seen where the previously absorbed particle layer may obstruct reactions between the incoming particles and the substrate. To generalize and handle uniformly these phenomena, the concept of "Small Reaction Surface" (SRS) is introduced.

FIGS. 3($a$) to 3($c$) are diagrams showing the concept of the small reaction surface (SRS). A small area at a specific point r of a side wall as depicted in FIG. 3($b$) is taken out of the side wall of a hole in the substrate as in FIG. 3(a). The small area surface each consists of an absorbed layer by several kinds of incoming particles and a layer to which an original clean surface of substrate material is exposed. The small area of FIG. 3(b) is clarified, as depicted in FIG. 3(c), depending upon the coverage ratios of the individual absorbed particle layers and the coverage ratios of the clean substrate surface exposing layer. The percentage ES(t, r) of occupied area by the clean substrate material at a certain time t is proportional to the number of sites where the substrate surface is exposed, and the percentage $AS^k$(t, r) of occupied area by the absorbed material k is proportional to the number of absorbed particles. At this time standardization is needed to meet the following conditions:

$$AS^k(t,r) \geq 0, ES(t,r) \geq 0 \quad (1)$$

and $$\sum_k AS^k(t,r) + ES(t,r) = 1$$

The concepts of etching and deposition on the small reaction surface are now discussed. Etching is defined as the phenomenon where the topography of the substrate advances inwardly of the substrate material as a result of desorption of reaction products from the substrate surface. Etching also covers mere desorption of the absorbed materials on the substrate as a result of a certain reaction in broader sense.

On the other hand, deposition is defined as the phenomenon where the topography of the substrate advances outwardly of the substrate material as a result of impingement or accumulation of radicals on the substrate or formation of a composite film.

Assume that deposition at a certain position r in the surface reaction model would not start until the small reaction surface (SRS) representative of that position is completely covered with the absorbed materials (ES=0). In other words, it is assumed that particles absorbed over the first absorbed layer do not react with the substrate immediately and brings about topographic deformation as deposition. When the word "deposition" is used in contrast to the word "absorption," it means that the particles are attached to the small reaction surface when ES=0. On the other hand, where the small reaction surface is not covered with the absorbed materials at all ($1 \geq ES > 0$), it is assumed that no deposition takes place and etching proceeds on the substrate.

A surface reaction model according to the present invention is based on the following notion. Etching and absorption reactions are defined individually for each of combinations, including combination of the incoming particles and the absorbed materials on the substrate or the substrate material itself, combination of the different absorbed materials on the substrate and combination of the absorbed materials and the substrate material. The average amount of reactions on each point of the small reaction surface is evaluated by multiplying the weights of $AS^k$ and ES.

FIGS. 4(a) to 4(d) illustrate the progress of etching reactions on the small reaction surface in the surface reaction model. FIG. 4(a) depicts the initial state where the surface consists of the substrate material only. Once etching has started under the initial state, particle absorption will be seen on the substrate surface simultaneously with etching of the substrate, as is shown in FIG. 4(b). As time passes by, absorption of the particles and etching of the absorbed particles themselves are repeated simultaneously with etching of the substrate and the number of the absorbed particles varies with the topographic deformation of the substrate surface, as is seen in FIG. 4(c). The absorbed particles may cover completely the S substrate surface in some cases, as shown in FIG. 4(d). In this instance, the substrate etching stops and deposition starts. As a matter of fact, the absorbed particle layer is formed on the substrate surface after the absorptive particles are absorbed or the absorbed particles are etched repeatedly with ever-changing topographic deformation of the substrate.

The above discussed surface reaction model for use in the topographic simulator considers FIG. 4 as a progress chart for seeking stationary solutions of the coverage ratio ES by the substrate material and the coverage ratios $AS^k$ by the individual absorbed particle layers. t is a virtual time needed until the stationary solutions are converged. Actual time T is fixed until the stationary solutions are obtained. The topography of the substrate surface will not vary while T is fixed. During this period external environments will not change, including the number of incoming ions and radicals at the small reaction surface at each point of the substrate surface, the incident angle thereof and incident energy distribution. Therefore, it is considered that the topography is settled at a certain stationary solution with the passage of t.

The following basic formula are simultaneous differential equations representing the coverage ratios $AS^k$ by the individual absorbed materials and the coverage ratios ES by the substrate material at each point of coordinates in relation with virtual time t.

$$\frac{d}{dt} AS^k(t,r) = TS^k \times (D^k(t,r) - E^k(t,r)) \cdot n(r) \quad (2)$$

$$\frac{d}{dt} ES(t,r) = \sum_k TS^k \times (E^k(t,r) - D^k(t,r)) \cdot n(r) \quad (3)$$

These equations are solved under the constrained conditions of equation (1). $D^k$(t, r) represents absorption rate vector of material k by incoming particles k at respective times t and respective positions r and $E^k$(t, r) represents etching rate vector of the absorbed material k. $TS^k$ is the reverse of the atom-to-atom distance of the material k. n(r) is externally extending normal vector of the substrate surface at point r.

Equation (2) indicates that the increase in the coverage ratios by the individual materials k is proportional to the difference between the absorption rate and etching rate of the materials k. Further, equation (3) indicates that the increase in the coverage ratio by the substrate material is proportional to a total sum of the differences between the etching rates and absorption rates of all of the materials k absorbed on the substrate material.

Calculation is repeated with increments of a definite small time slot $\Delta t$ until the two kinds of differentiations $dAS^k/dt$ and dES/dt in the left side of the equations (2) and (3) become stationary with sufficient accuracy under the constrained condition of equation (1). The stationary solutions of the two kinds of differentiations may be found in the following two cases. One is the case where ES is settled at a definite value other than 0. In other words, this is the case where the environment is set up to permit etching at coordinates point r. The stationary solutions to settle at this time are represented as follows:

$$\frac{d}{dt} AS^k(t,r) = 0, \frac{d}{dt} ES(t,r) = 0 \quad (4)$$

The solutions of $AS^k$ and ES are both definite values between 0 and 1. The other is the case where ES is 0. In other words, this is the case where the environment is set up to permit deposition at coordinates point r. The stationary solutions to settle at this time are represented as follows:

$$\frac{d}{dt} AS^k(t,r) = \sigma^k \geq 0, \quad (5\text{-}1)$$

$$\frac{d}{dt} ES(t,r) = 0 \quad (5\text{-}2)$$

$\sigma^k$ is a value between 0 and 1. The solutions of $AS^k$ and ES which satisfy equations (5-1) and (5-2) are expressed as follows:

$$\sum_k AS^k(t,r) = 1, ES(t,r) = 0 \quad (6)$$

Equation (5-1) may be said to express "intent" to develop deposition layers from a single layer to a multiple layer structure, because deposition is dominant over etching in a given system.

As will be discussed in detail later, etching takes place on the substrate at the etching rates as determined by the substrate materials at respective points and respective times based on $AS^k(t^*, r)$ and $ES(t^*, r)$ sought as solutions of the above equations, where $t^*$ is a virtual time for obtaining the a stationary solutions. Deposition proceeds on the substrate in proportion to a total sum of the absorption rates of the individual absorbed materials k as determined at representative
points of the small reaction surface where the coverage ratio ES by the substrate material is zero, and at respective time slots.

The operational principle discussed so far may be summarized as follows: It is evaluated as to what kinds of etching or deposition reactions may take place at each point of the substrate and the extent to which those reactions may take place in relation with each other. To this end, the concept of the small reaction surface at each of points is introduced and the percentages $AS^k$ and ES of occupied area are taken into account. Assume now that the suffix k represents the active radicals. $AS^k$ and ES for different k provide ratios of different environments for etching reactions. On the other hand, assume that the suffix k represents the non-active radicals. The corresponding $AS^k$ provides ratios of different environments where a deposited film may be developed to block the etching reactions. Put in another way, the environments of the etching and deposition reactions at each point of the substrate surface are etching rate and the deposition rate themselves are not calculated or evaluated, which vary the substrate topography.

The following sets forth the method for evaluating the reaction rate of the etching and absorption reactions using the above described surface reaction progress model. More detailed ways of expression of $D^k$ and $E^k$ in the right sides of the fundamental formula (2) and (3) are discussed below. This is followed by discussions of the substrate etching rate and deposition rate which bring about topographic deformation of the substrate.

The three types of etching reactions, (1) reactions by radicals, (2) reactions by ions, and (3) synergistic effects by ions and active absorbed particles, are handled here. The etching rates of these respective reactions are considered separately for the absorbed materials on the substrate and for the substrate material itself.

The etching rate vector $E^k$ for the absorbed material k may be expressed by equation (7). Each of element etching rate vector for the respective reactions is multiplied by the coverage ratios $AS^k$ by the individual absorbed materials which gives the weight or reaction frequency. In case of ion-assisted etching, multiplication by the coverage ratio $AS^j$ by intervening absorbed materials is necessary.

$$E^k(t,r) = \sum_j E_{cr}^{jk}(t,r) \times AS^k(t,r) + \quad (7)$$

$$\sum_i (E_{psp}^{ik}(t,r) + E_{csp}^{ik}(tr)) \times AS^k +$$

$$\sum_i \sum_j E_{acc}^{ijk}(t,r) \times AS^j(t,r) \times AS^k(t,r) + \sum_i E_{acc}^{ick}(t,r) \times AS^k(t,r)$$

The first item represents the etching rate where the absorbed material k is etched with the radicals j due to the thermally induced chemical reactions. This element etching vector $E_{cr}^{jk}$ is defined as follows by using a reaction rate $B_{cr}^{jk}$ for the material k present on the substrate and the incoming particles j:

$$E_{cr}^{jk}(t,r) = B_{cr}^{jk} \times J^j(t,r) \quad (8)$$

$$B_{cr}^{jk} = A \exp\left(-\frac{Q^{jk}}{k_B T_S}\right) \quad (9)$$

where $J^j$ is the flux vector of the incoming radicals j, $B_{cr}^{jk}$ is a so-called Aleneus type reaction rate, $k_B$ is a Boltzmann constant, $T_s$ is substrate temperature, $Q^{jk}$ is active energy of etching reactions and A is a proportional constant.

$E_{psp}^{ik}$ and $E_{csp}^{ik}$ in the second item represent element etching rate vectors when the absorbed materials k are etched by ions in physical sputtering or chemical sputtering. $E_{ass}^{ijk}$ in the third item represents element etching rate vector when ion-assisted etching reactions take place. In other words, this is the rate of etching the absorbed materials k when the incoming ions i having sufficient kinetic energy stimulate reactions between the absorbed materials on the substrate and the active particles j attached thereon. $E_{ass}^{iek}$ in the fourth item similarly represents the etching rate vector in case of ion-assisted etching. This rate shows the etching rate at which the ions i stimulate reactions between the absorbed materials k and the substrate material e to etch the absorbed materials k. In the following discussion, the third item is not taken into account. The element etching rate vectors $E_{psp}^{ik}$ and $E_{csp}^{ik}$ may be generally represented as follows through the use of sputter rates $Y_{psp}^{ik}(\epsilon)$ $Y_{csp}^{ik}(\epsilon)$ as defined as a function of the incident energy $\epsilon$ of the ions:

$$E^{ik}_{psp,csp}(t,r) = \int_{ea} Y^{ik}_{psp,csp}(\epsilon) \times J^i(t,r,\epsilon)d\epsilon \qquad (10)$$

where $J^i$ is the flux vector of the incoming ions i and xxx is a threshold level of energy necessary to cause reactions between the materials k and the ions i. The element etching rate vectors $E_{ass}^{iek}$ by ion-assisted etching may also be generally represented as with equation (10) through the use of reaction rates $Y_{ass}^{ek}(\epsilon)$ defined for combinations of the materials k on the substrate and the substrate material.

The substrate etching rate vector plays an important role in changing the topography of the substrate surface. Although it is not apparent from the fundamental formula (2) and (3), this has indirect impact on $AS^k$ and ES by changing the flux distribution of the incoming particles incident on the small reaction surface with the progress of the topographic deformation.

Like the etching rate vector $E^*$ of the absorbed materials, the etching rate vector E of the substrate e at individual points and individual times may be represented as follows by combining the three reactions, the thermally induced chemical reactions, sputtering and ion-assisted etching:

$$E(t,r) = \sum_j E^{je}_{cr}(t,r) \times AS^j(t,r) + \sum_i E^{ic}_{psp}(t,r) + \qquad (11)$$

$$E^{ie}_{csp}(T,R)) \times ES(t,r) + \sum_i \sum_k E^{ike}_{ass}(t,r) \times AS^k(t,r)$$

The third item gives the rate at which the substrate material e is etched by exciting the reactions between the absorbed materials k on the substrate and the substrate material e with the ions i. This reaction is correlated with the reactions in the fourth item of equation (7) and attention is called to the fact that the two reactions take place simultaneously as a single combination. Etching is effected only when the percentage of occupied area by the substrate material has a definite value other than zero and E has implications only when this occurs.

Absorption (deposition) is dependent upon absorption rate defined for combination of the incoming particles and the materials on the substrate. Absorption rate vectors $D^k$ of the respective materials are defined by equation (12):

$$D^k(t,r) = \sum_k D^{km}(t,r) \times AS^{km}(t,r) + D^{ke}(t,r) \times ES(t,r) \qquad (12)$$

where $D^{km}$ is element absorption rate vector when the incoming particles k are absorbed on the absorbed materials m and $D^{ke}$ is element absorption rate when the incoming particles k are absorbed on the clean substrate e. In other words, the absorption rate vector $D^k$ of the materials k is calculated by weighing and averaging the element absorption rate vectors for each of combinations of the incoming particles k and the individual materials on the substrates with the coverage ratios by the individual materials on the small reaction surface.

The element absorption rate vector $D^{km}$ is represented as follows:

$$D^{km}(t,r) = -HD^k \times J^k(t,r) \times \delta^{km} \qquad (13)$$

where jk is the flux vector of the incoming particles k and $\delta^{km}$ is absorption ratio of the incoming particles k to the materials m. The element absorption rate vector $D^{km}$ is proportional to the number of the incoming particles k absorbed on the material m per unit time, with its proportional constant being $HD^k$. The growing direction of absorption (deposition) is opposite to the flux vector $J^k$ of the incoming particles k.

The deposition rate vector D which determines the topography deformation of the substrate is defined as a total sum of the differences between the absorption rate vectors of all of the absorbed materials and the etching rate vector. Deposition will start when the coverage ratio ES by the substrate material is zero and D has implications only when this occurs.

$$D(t,r) = \sum_k (D^k(t,r) - E^k(t,r)) \qquad (14)$$

The foregoing description sets forth how to formulate the reactions and the fundamental formula in the surface reaction model. Physical amounts giving rise to topographic deformation of the substrate are two; the etching rate E as defined by equation (11) and the deposition rate D as defined by equation (14).

Figure 5:
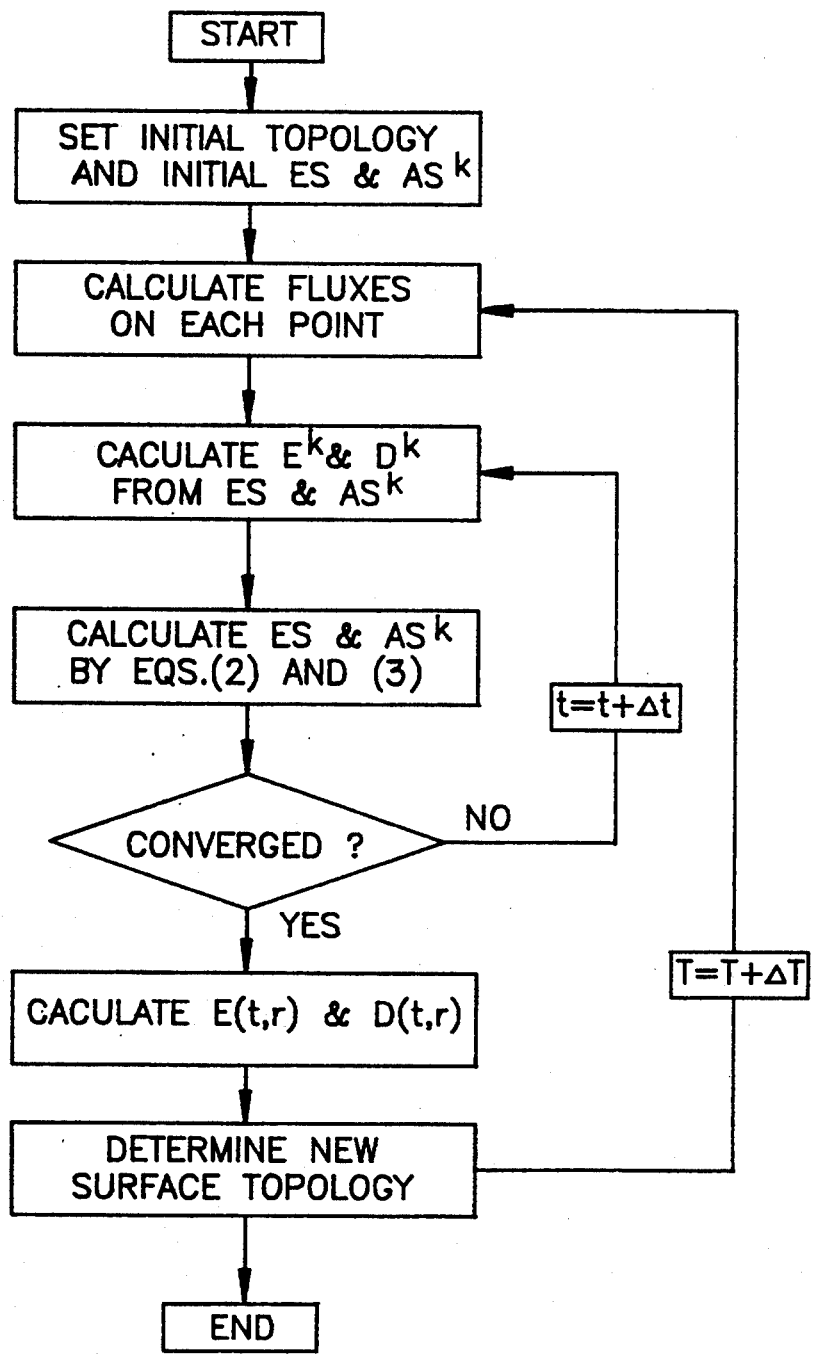
FIG. 5 is a flow chart for calculating topological deformations of the substrate surface based on the surface reaction model according to the present invention.

FIG. 5 is a basic calculation flow of the topography simulator designed based on the above illustrated surface reaction mode according to the present invention. By a converging loop at a virtual time t, stationary solutions are sought for the coverage ratios $AS^k$ by the individual absorbed particles and the coverage ratio ES by the substrate material at each point of the small reaction surfaces on the substrate surface. Though the use of those solution, the etching rate vector E (when ES>0) or the deposition rate vector D (when ES=0) are evaluated pursuant to equations (11) and (14). The topography of the substrate is deformed at the respective points of the substrate surface in the directions of those vectors. The above evaluation processes are repeated to evaluate a new surface topography from time to time whenever the actual time T advances by a small time increment $\Delta T$.

Figure 6:
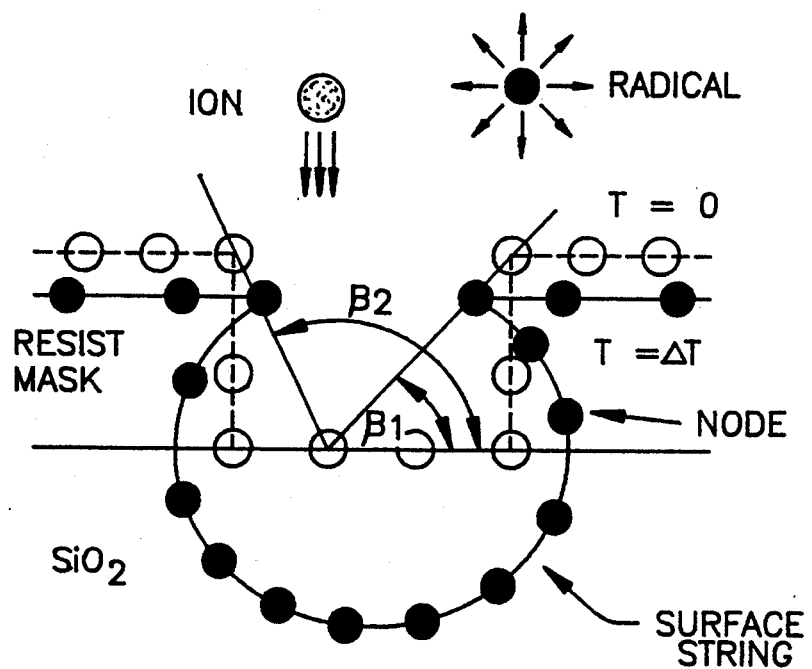
FIG. 6 is a schematic diagram of a string model.

The topography deformation of the surface along the passage of the actual time T is expressed by using a new string model. FIG. 6 is a two-dimensional cross sectional view for explaining the string model. A plurality of nodes on a surface string at a certain time T are considered as points representing the small reaction surface at each point. The surface string at time T=0 and node points denoted with white circles on the string are drawn along the initial topography of the mask. After $\Delta T$, the node points with the white circules move to node points with black circles as a result of etching or deposition. Therefore, a new surface string or a new surface topography is formed. The string model is applicable to the situation where etching and deposition take place on the same surface string or etching takes place at a certain node point and deposition takes place at another node point at the same time.

The surface reaction model according to the present invention is applied to silicon oxide layer etching for formation of a trench structure (groove shape of an indefinite depth). Assume that molecule mixture gas of fluorine F, carbon C and hydrogen H is used as etching gas. Low pressure conditions are assumed where the averaged free travel paths of particles are sufficiently long as compared with rugged profiles of the substrate surface.

Generally speaking, it is difficult to identify the configurations or ratios of radicals and ions produced as a result of dissolution, or excitation or electric discharge of molecules in a plasma. Radicals may be classified into two categories. One is fluorine radicals [F] which may give rise to thermally induced chemical reaction with an oxide film substrate. The other is molecular radicals (hydrofluorcarbon radicals) $[C_mH_nF_x]$ comprising carbon, hydrogen and fluorine which may give rise to polymer deposition. The ions are handled collectively as a single kind of molecular ions.

Figure 7:
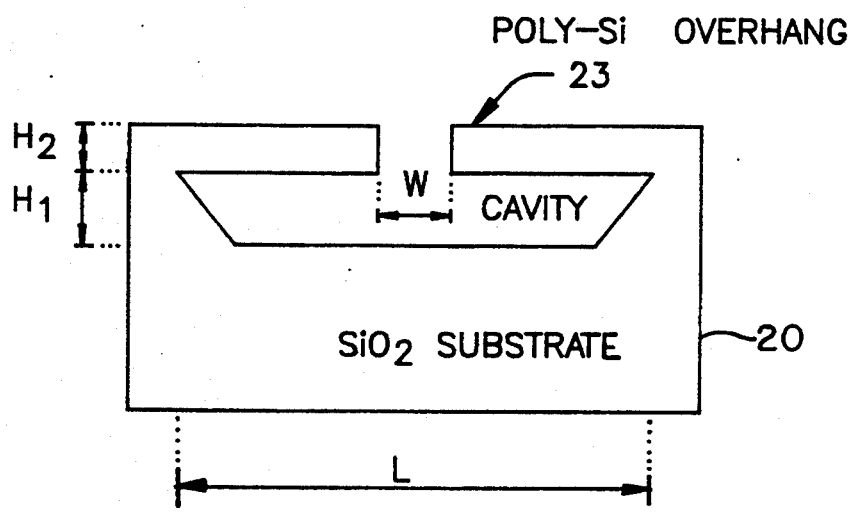
FIG. 7 is a cross sectional view of an overhang test structure to which the present topography simulator is applied for dry-etching processes.

It is necessary to identify in practically recognizable form the amounts of the fluxes of the respective radicals and ions being transported to the substrate and the flux ratio thereof, if the gas ration, flow rate or pressure of the mixing etching gas or external parameters such as RF power and frequency are changed. It is further required to evaluate and determine the ratio of radical absorption on the substrate, the ratio of ion sputtering and other factors. To meet these two requirements, a specimen of a special structure as shown in FIG. 7 was prepared. Etching was conducted on the specimen with the CHF mixing gas.

Figure 8A:
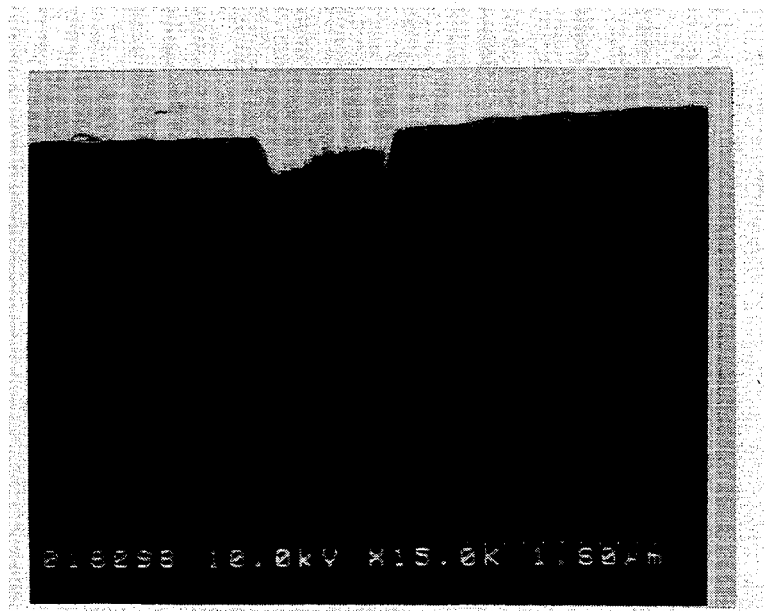
FIG. 8($a$) is a cross sectional SEM microphotograph of the test structure after RIE etching, and FIG. 8($b$) show simulational results for the overhang test structure.
Figure 8B:
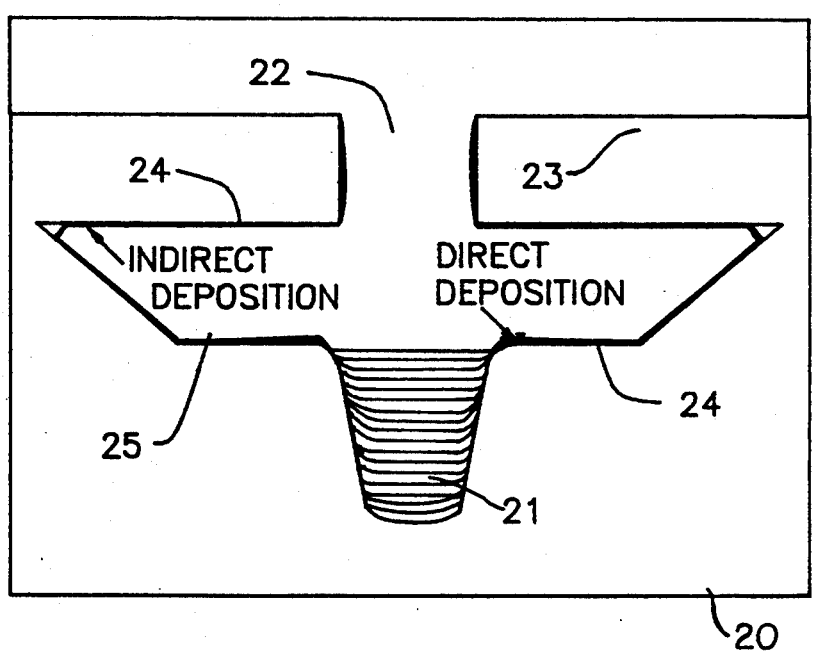

FIG. 8 is a cross-sectional SEM (scanning-electron-microscopic) microphotograph of the test structure after etching. The experimental conditions were as follows: The etching gas was $CF_4$, $CH_2F_2$ and He mixing gas. The gas flow rates were 30 sccm, 10 sccm and 80 sccm; pressure was 60 mTorr (8 Pa). RF power was 330 W and RF frequency was 13.56 MHz. FIG. 8(b) illustrates simulational results after the parameters were fitted and fixed and simulation was effected under the conditions of FIG. 8(a). FIG. 8(b) clearly illustrates formation of a trench 21 beneath a hole 22 in a polysilicon overhang 23 mainly by the ion-assisted etching reactions and growth of deposited layers 24 in a cavity 25 closed with the overhang 23 by direct deposition and indirect deposition. The direct deposition is due to non-active radicals arriving directly at the substrate from an upper portion of the specimen 20 and being absorbed thereon. The indirect deposition is due to the non-active radicals which arrived at the substrate once and reflected and desorbed from the substrate and then absorbed somewhere else on the substrate. It is noted that the effect of such reflection and desorption is substituted by isotropic radical fluxes in the cavity 25.

The side wall of the hole 22 in the overhang 23 has a larger line-of-sight angle (corresponding to the difference between $\beta_2$ and $\beta_1$ in FIG. 6) with regard to the radicals transported isotropically from above, as compared with respective lower points on the substrate. For this reason, the deposited layers grown on the side walls are relatively thicker. Simultaneously, the deposited layers are etched by physical sputtering due to the ions incident substantially in a vertical direction. The upper portions of the deposited layers are more etched to a thinner thickness than the lower portions thereof. On the other hand, the trench 21 beneath the hole 22 in the overhang 23 has a smaller incident line-of-sight angle of the radicals than that at the overhang hole 22 so that the supply of the non-active radicals is small and growth of the deposited layers is not appreciable.

Figure 9A:
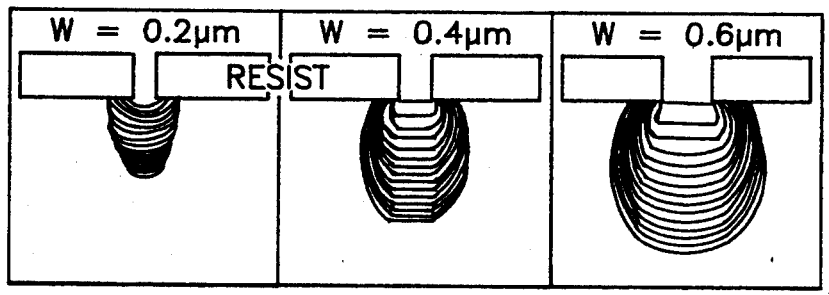
FIGS. 9($a$) and 9($b$) show simulational results of $SiO_2$ etching for infinite-trench configuration where only thermally induced chemical reactions by active fluorite radicals is considered, wherein FIG. 9($a$) shows a transport-limited case and FIG. 9($b$) shows a reaction-rate-limited case.
Figure 9B:
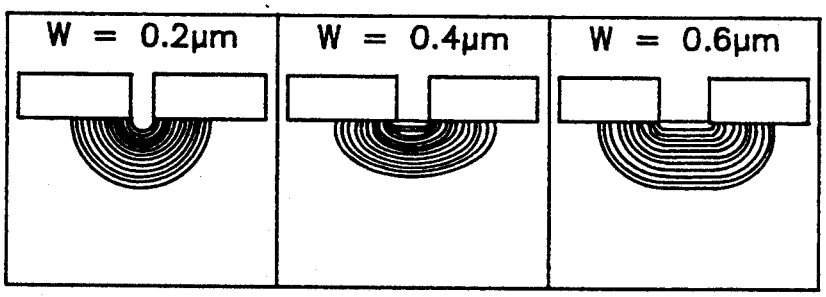

FIGS. 9(a) and 9(b) show calculation examples taking into account only the thermally induced chemical reactions by the active fluorine radicals [F]. FIG. 9(a) is an example of the transport-limited case where the amount of radicals supplied is smaller than the amount of reactions on the substrate surface and the etching rate is so-called transport-limited. Under the above mentioned prerequisite that the mean free path of the particles be sufficiently long, the radicals having a line-of-sight angle within the hole 22 of width W are permitted to enter. As a consequence, etching is dominant in an incident direction. It is recognized that etching is much advanced in the direction of depth as compared with in a lateral direction. If the width W of the hole 22 increases, then the etching rate in the direction of depth per unit time increases. This is due to the fact that the line-of-sight angles at each of node points are enlarged to increase the amount of the incident radicals at those points.

FIG. 9(b) shows an example of a reaction-rate-limited case where the amount of the radicals supplied is substantially larger than the amount of reactions on the surface and the etching rate is so-called reaction-rate-limited. Since the substrate surface is always covered with the absorbed radical layers, reactions with next incoming radicals will be suppressed until reactions between the absorbed radicals and the substrate material are over. At this time etching proceeds substantially isotopically. In this case, no change is seen in the etching rate in the direction of depth even if the width W of the hole 22 increases.

Figures 10A, 10B, 10C:
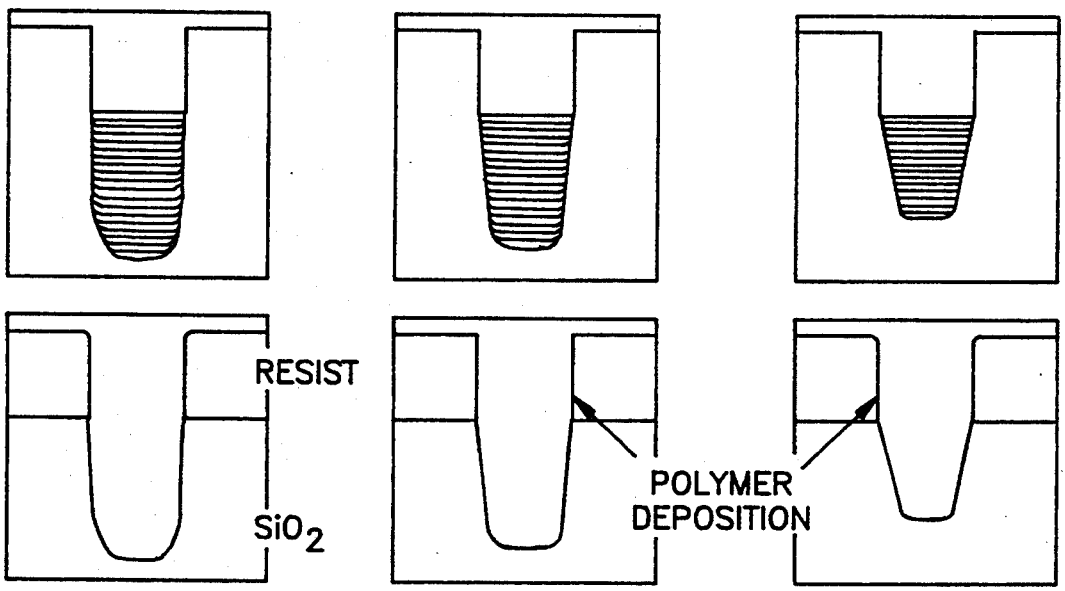
FIGS. 10($a$) to 10($c$) show simulational results of $SiO_2$ etching for infinite-trench configuration.

FIGS. 10(a) to 10(c) show typical calculation methods where all kinds of reaction processes treated here are taken into account, provided however that the relative ratio of the ion flux $J_i$ to the flux $J_F$ of the fluorine radicals [F] is fixed as $J_F = 100 J_i$. Furthermore, the relative ratio $\alpha = J_{CHF}/J_i$ of the flux $J_{CHF}$ of non-active hydrofluorcarbon radicals $[C_mH_nF_x]$ which bring about deposition is varied. The upper column illustrates the progress of topographic deformation at each time slot T through the use of the string model, whereas the lower column shows the final topography of the substrate surface. The deposited layers on the trench side walls are marked clearly in black. FIG. 10(a) shows an example where $\alpha = 1$. So-called bowing is found in the topography, which is not desirable in terms of size and topography control, because isotropic etching components are present inwardly of the mask. FIG. 10(b) shows an example where $\alpha = 10$. Etching is seen substantially in exact alignment with the size of the mask from beneath the mask to the bottom, although the trench configuration is somewhat tapered. This is due to the fact that growth of carbon polymer layers by the hydrofluorcarbon radicals, etching by the thermally induced chemical reactions with the active fluorine radicals, and ion sputtering of the polymer layers are kept in good balancing condition at each point of the side walls. FIG. 10(c) shows an example where $\alpha = 30$. When deposition is remarkable, the trench configuration bears a forward tapered shape at a substantial angle and the bottom thereof becomes smaller. Furthermore, the etching rate decreases in a vertical direction.

It will be apparent that many modifications and variations may be effected without departing from the scope of the novel concepts of the present invention.

What is claimed is:

1. A dry-etching process wherein minute patterns formed in a lithography process are used as mask and an operation unit in a topography simulator evaluates etching and deposition rates for determining the optimum etching conditions in forming on a substrate patterns of the same sizes as that of the mask, said rate evaluation process in the dry-etching process comprising the steps of:
- (a) evaluating a coverage ratio by absorbed materials on individual small areas of the substrate surface from the density of the respective radicals and ions in an active gas plasma and the reaction rate of the respective radicals and ions, and
- (b) evaluating etching and deposition rates on the individual small areas of the substrate surface from the coverage ratio by the absorbed materials.

2. A dry-etching process according to claim 1 wherein the evaluation of the coverage ratio by the absorbed materials on individual small areas of the substrate comprises the steps of:
- (a) evaluating the amount of absorption of the respective absorbed materials per unit time and the amount of desorption of the respective absorbed materials per unit time and
- (b) evaluating such a ratio of the absorbed materials as to equal the amount of absorption and the amount of desorption per unit time.

3. A dry-etching process according to claim 1 wherein the evaluation of the etching and deposition rates comprises the step of:
- (a) considering the situation where the area is entirely covered with the absorbed materials as deposition and the situation where the area is only partially covered with the absorbed materials as etching.

4. A dry-etching process according to claim 1 wherein the etching and deposition rate evaluation involves
- (a) a step of determining a reaction rate by combinations of the absorbed materials and the substrate in proportion to the coverage ratios by the respective absorbed materials,
- (b) a step of determining a reaction rate by combinations of the radicals and ion arriving at the substrate surface and the substrate in proportion to the extent to which the area is not covered with the absorbed materials and to the fluxes of the individual incoming particles,
- (c) a step of determining a reaction rate by combinations of the absorbed materials, the substrate and the individual incoming radicals and ions in proportion to the coverage ratios of the individual absorbed materials and the fluxes of the individual incoming particles, and
- (d) a step of combining these reaction rates for evaluating the etching and deposition rates.

5. A dry-etching process wherein minute patterns formed in a lithography process are used as mask and an operation unit in a topography simulator evaluates etching and deposition rates for determining the optimum etching conditions in forming on a substrate patterns of the same sizes as that of the mask, said rate evaluation process in the dry-etching process comprising the steps of:
- (a) evaluating the coverage ratio by absorbed materials on individual small areas of the substrate surface, and
- (b) evaluating etching and deposition rates on the individual small areas of the substrate surface from the coverage ratio by the absorbed materials.

6. A dry-etching process wherein minute patterns formed in a lithography process are used as mask and an operation unit in a topography simulator evaluates etching and deposition rates for determining the optimum etching conditions in forming on a substrate patterns of the same sizes as that of the mask, said dry-etching process comprising the step of:
- (a) taking into account the amount of reaction between absorbed materials and a substrate for etching rate evaluation when etching profiles are simulated during the dry-etching process.

* * * * *